(12) United States Patent
Muth

(10) Patent No.: US 6,501,261 B2
(45) Date of Patent: Dec. 31, 2002

(54) EVALUATION CIRCUIT FOR A MAGNETORESISTIVE SENSOR

(75) Inventor: Michael Muth, Stelle (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/797,087

(22) Filed: Mar. 1, 2001

(65) Prior Publication Data

US 2001/0020845 A1 Sep. 13, 2001

(30) Foreign Application Priority Data

Mar. 2, 2000 (DE) .......................................... 100 10 370

(51) Int. Cl.$^7$ ................................................ G01P 3/48
(52) U.S. Cl. ................... 324/166; 324/207.12; 324/252
(58) Field of Search ................................. 324/166, 173, 324/168, 207.21, 207.25, 207.12, 252, 225; 338/32 R

(56) References Cited

U.S. PATENT DOCUMENTS 5,231,351 A * 7/1993 Kordts et al. ................ 324/166
5,497,084 A * 3/1996 Bicking .................. 324/207.25

* cited by examiner

*Primary Examiner*—Edward Lefkowitz
*Assistant Examiner*—Subhash Zaveri
(74) *Attorney, Agent, or Firm*—Steven R. Biren

(57) ABSTRACT

In an evaluation circuit for evaluating an output signal of a magnetoresistive sensor (1) for rotational speed measurement, in which the evaluation circuit performs an offset compensation of the sensor signal and comprises a comparator (4) which receives the offset compensated sensor signal and compares it with a reference voltage, a reliable identification of the output signal of the sensor after switching on the arrangement is ensured in that, in an initial mode, the value of the reference voltage is selected in dependence upon the temperature, the temperature dependence being approximated to that of the sensor signal, in that a control unit (6) is provided which, in the initial mode, consecutively checks whether the sensor signal is present, triggers the offset compensation only after the presence of said signal, subsequently checks whether the comparator (4) supplies an output signal, and changes over to a control mode only after the presence of said signal, in which control mode the temperature dependence of the reference voltage is switched off and, instead, the reference voltage is adjusted to approximately 40% of the maximum amplitude of the offset-compensated sensor signal.

5 Claims, 1 Drawing Sheet

EVALUATION CIRCUIT FOR A MAGNETORESISTIVE SENSOR

Figure 1:
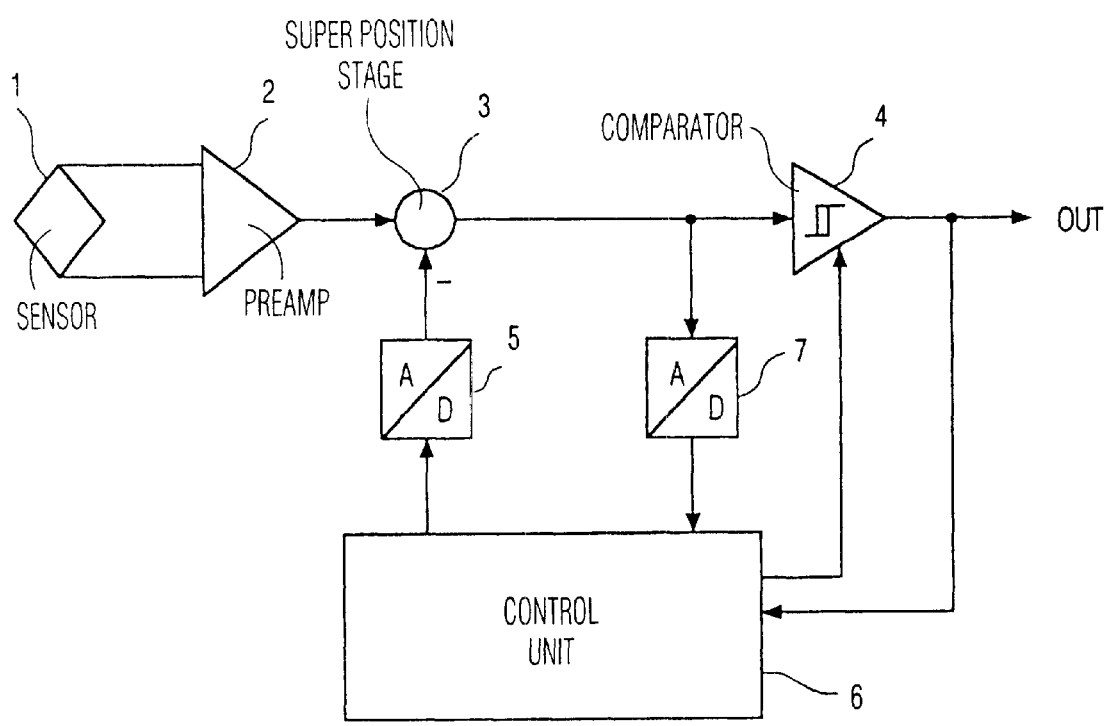

The invention relates to an evaluation circuit for evaluating an output signal of a magnetoresistive sensor for rotational speed measurement, in which the evaluation circuit performs an offset compensation of the sensor signal and comprises a comparator which receives the offset-compensated sensor signal and compares it with a reference voltage.

Such evaluation circuits are marketed, for example, by Philips. They are used for processing the output signals from magnetoresistive sensors in anti-blocking systems for motor vehicles. These sensors supply signals which are dependent on the rotational speed of the wheels of the vehicle. They have an offset compensation which is intended to eliminate the DC component in the possibly amplified output signal of the sensor. The offset-compensated signal is processed by means of a comparator which essentially ensures that interference signals are eliminated. To this end, the comparator compares the offset-compensated sensor signal with a reference voltage.

After such an arrangement has been switched on, there is the problem that neither the temperature nor the distance between the sensor and the magnetized disc whose rotational speed is measured by means of the sensor are known. Therefore, the amplitude of the sensor signal is not known either. This involves the risk that, for example, in a vehicle which is standing still, interference modulation occurring in the output signal of the sensor is interpreted as a sensor signal and that both the offset compensation and the adjustment of the reference voltage are carried out with reference to this interference modulation. In that case, a control mode would already start, although the vehicle is not moving. This is unacceptable.

It is an object of the invention to improve the arrangement described above to such an extent that, after switching on, it is reliably adjusted only to actual sensor output signals rather than to possible interference signals.

According to the invention, this object is solved in that in an initial mode, the value of the reference voltage is selected in dependence upon the temperature, the temperature dependence being approximated to that of the sensor signal, in that a control unit is provided which, in the initial mode, consecutively checks whether the sensor signal is present, triggers the offset compensation only after the presence of said signal, subsequently checks whether the comparator supplies an output signal, and changes over to a control mode only after the presence of said signal, in which control mode the temperature dependence of the reference voltage is switched off and, instead, the reference voltage is adjusted to approximately 40% of the maximum amplitude of the offset-compensated sensor signal.

The invention is based on the recognition that the problem described above is based on the fact that a control unit in the arrangement does not know the temperature on the side of the sensor. In fact, its output signal is greatly dependent on temperature, i.e. the amplitude clearly decreases with an increasing temperature. When the arrangement is switched on and attempts to evaluate a sensor signal, the control unit does not know which temperature prevails. This problem becomes even more serious because the distance between the sensor and a sensor wheel scanning the sensor magnetically is neither known but that this distance also has a considerable influence on the amplitude of the sensor output signal. The result of this overall problem is that the output amplitude of the sensor may be very different but that simultaneously the cause (temperature or distance) after switching on is not known. Consequently, this involves the risk that the evaluation circuit performs both the offset compensation and the adjustment of the reference voltage at which the comparator operates with reference to a modulation signal having a small amplitude and being actually an interference signal. This may also be triggered, for example, by small vibrations of the sensor wheel when the vehicle is standing still, which vibrations may be particularly caused by the engines.

The arrangement according to the invention obviates this in that it changes, in an ordered manner, from an initial mode to a control mode.

The reference voltage is chosen to be such that it is also temperature-dependent. The type and value of the temperature dependence is chosen to be similar to that of the sensor. Thus, with a changing temperature, the value of the reference voltage and the amplitude of the sensor output signal are approximately proportional to each other.

This property is utilized by a control unit which initially checks in an initial mode whether a sensor signal is present. To this end, a possibly amplified and possibly analog/digitally converted output signal of the sensor is checked instead of the output signal of the comparator. Only when such a sensor signal is present does the control unit start the offset compensation. A DC component which may be present in the output signal of the sensor is then eliminated. When an adjustment of this offset compensation has taken place, it is subsequently checked whether the comparator supplies an output signal. This check is important because, based on the temperature-dependent selection of the reference voltage, the comparator only supplies an output signal when the output signal of the sensor actually has such a value in dependence upon the temperature that it is certainly a sensor signal and not an interference modulation. This is achieved in response to the temperature dependence of the reference voltage whose value is adjusted in dependence upon the temperature to the expected amplitude of the sensor signal. Only when the comparator supplies an output signal may it be assumed that it is a regular sensor signal. The control unit then changes over to a control mode in which the reference voltage is no longer chosen to be temperature-dependent but in which the reference voltage is adjusted to approximately 40% of the maximum amplitude of the offset-compensated control signal. Now, a direct coupling of the value of the reference voltage with the actual amplitude of the sensor signal takes place.

As a result, it is achieved by means of this arrangement according to the invention that, due to the temperature dependence of the reference voltage and the evaluation of the output signal of the comparator of the control unit, information is provided on the presence of an actual sensor signal at a given temperature. This is achieved in that the comparator only supplies an output signal when the sensor itself actually supplies an output signal.

The arrangement according to the invention obviates separate use of a temperature sensor which would involve additional costs and additional components.

In an embodiment of the invention as defined in claim 2, it is advantageous that the arrangement triggers the initial mode particularly after switching on the sensor and/or the evaluation circuit, because it is exactly at this moment that the actual cause of the value of the amplitude of the sensor is initially unknown.

The evaluation of the output signal of the comparator, which may be basically an analog signal, can be digitally evaluated, as described in accordance with a further embodiment of the invention as defined in claim 3. This means that it can only be checked in the simplest case whether such a signal is present or absent. The value of the signal then does not play any role. Thus, a simple yes/no decision can be taken.

The temperature dependence of the reference voltage in the initial mode can be generated relatively easily by means of a current mirror circuit which is known in the IC technique and supplies the desired voltage variation upon a changing temperature.

These and other aspects of the invention are apparent from and will be elucidated with reference to the embodiments described hereinafter.

In the drawing:

The FIGURE shows a block diagram of a sensor 1 and an evaluation circuit according to the invention.

A sensor denoted by the reference numeral 1 in the diagram is, for example, a magnetoresistive rotational speed sensor which supplies information about the rotational speed of a wheel (not shown) of a vehicle or a sensor wheel coupled thereto to an anti-blocking system in a vehicle accommodating the sensor and the evaluation circuit. To this end, the magnetoresistive sensor 1, which may have the form of a resistance bridge, supplies two output signals to a preamplifier 2 whose output signal is applied to a superposition stage 3. The output signal of the superposition stage 3 is applied to a comparator 4 which compares this signal with another signal which will be elucidated hereinafter. Only when the sensor signal exceeds the comparison signal at a positive amplitude and falls below it at a negative amplitude does the comparator 4 supply an output signal which is denoted by OUT in the FIGURE and can be evaluated as a sensor signal and supplies information about the rotational speed of the wheel which is scanned by means of the sensor 1.

In such an arrangement, there is the problem that an offset compensation must be performed and that the amplitude of the output signal of the sensor 1 or of the preamplifier 2 is strongly dependent on temperature. Moreover, this amplitude is also dependent on the distance between the sensor 1 and the sensor wheel (not shown).

Therefore, a control unit 6 is provided which evaluates an output signal of an A/D converter 7 whose input receives the output signal from the superposition stage 3. The output signal from the superposition stage 3 is thus available in a digital form in the control unit 6. It can evaluate and compensate the DC component of the signal. This is effected in that the DC component is supplied in a digital form to a D/A converter 5 and is superimposed in the superposition stage 3 with the negative sign of the output signal from the preamplifier 2. The actual DC component coming from the preamplifier 2 and the signal serving for compensation and coming from the D/A converter 5 and the control unit 6 are thereby compensated in the superposition stage 3. The output signal of the superposition stage 3 is thus freed from possible DC components.

The problem already mentioned above, which particularly occurs after the evaluation circuit or the sensor has been switched on, is eliminated as follows by the control unit 6.

After the evaluation circuit has been switched on, it initially starts in an initial mode. In the initial mode, the control unit 6 checks whether a sensor signal is present, i.e. whether the A/D converter 7 supplies a signal which is unequal to zero. When this is the case, the control unit performs the offset compensation in the manner described above. The DC component in the output signal from the superposition stage 3 is thereby eliminated.

Subsequently the control unit 6 checks whether the comparator 4 supplies an output signal. Only when this is the case does the control unit 6 recognize by the existence of such an output signal of the comparator 4 that the sensor actually supplies an output signal and that there is no question of, for example, an interference modulation.

This is possible in that, in the initial mode to which it is changed by means of the control unit 6, the comparator 4 compares the output signal from the superposition stage 3 with a reference voltage which is not constant but is selected in dependence upon the temperature. The type and value of the temperature dependence of the reference voltage is chosen to be similar as the type and value of the temperature dependence of the output voltage of the sensor 1.

When, on the basis of the prevailing temperature, a large output signal of the sensor 1 is to be expected, the reference voltage is thus also increased accordingly. When, particularly at a high temperature, a small output signal of the sensor 1 is to be expected, the reference voltage is decreased accordingly. Thus, the reference voltage is adapted to the prevailing temperature and thus also to the expected amplitude of the sensor signal. For example, when switching on the arrangement and the sensor, this ensures that a small interference modulation, which is clearly lower than the expected amplitude of the sensor signal, is not evaluated as the actual sensor signal and would erroneously trigger a control with reference to this signal.

It should be noted that the adaptation of the reference voltage to the temperature in the manner described above only takes place during the initial mode. At the instant when the control unit 6 recognizes an output signal from the comparator 4, the control unit changes, however, from the initial mode to a control mode. In this control mode, the reference voltage is no longer chosen in dependence upon the temperature but is adjusted in dependence upon the amplitude of the output signal of the sensor and the superposition stage 3 in such a way that it is approximately 40% of the maximum amplitude of the sensor signal. In this mode, a continuous adaptation to the value of the amplitude of the sensor signal takes place via this amplitude which may further fluctuate due to temperature dependences and the like.

The procedure carried out by the control unit 6 in the initial mode obviates the problem occurring after switch-on, because the control unit 6 initially does not know the temperature and thus neither knows the value of the amplitude of the sensor signal. This problem is obviated by the temperature dependence of the reference voltage supplied to the comparator 5. Due to this temperature dependence, the comparator 4 only supplies an output signal when a sensor signal is actually present. This property is in turn utilized for switching over from the initial mode to the normal control mode.

The arrangement according to the invention thus solves this problem in a simple way after switch-on without a separate temperature sensor being required. The dependence of the reference voltage on the temperature in the initial mode can be realized, for example, by means of a temperature-dependent current mirror circuit.

What is claimed is:

1. An evaluation circuit for evaluating an output signal of a magnetoresistive sensor (1) for rotational speed measurement, in which the evaluation circuit performs an offset compensation of the sensor signal and comprises a comparator (4) which receives the offset-compensated sensor signal and compares it with a reference voltage, characterized in that, in an initial mode, the value of the reference voltage is selected in dependence upon the temperature, the temperature dependence being approximated to that of the sensor signal, in that a control unit (6) is provided which, in the initial mode, consecutively checks whether the sensor signal is present, triggers the offset compensation only after the presence of said signal, subsequently checks whether the comparator (4) supplies an output signal, and changes over to a control mode only after the presence of said signal, in which control mode the temperature dependence of the reference voltage is switched off and, instead, the reference voltage is adjusted to approximately 40% of the maximum amplitude of the offset-compensated sensor signal.

2. An evaluation circuit as claimed in claim 1, characterized in that the control unit (6) triggers the initial mode after switching on the sensor (1) and/or the evaluation circuit.

3. An evaluation circuit as claimed in claim 1, characterized in that the control unit (6) receives the output signal of the comparator (4) which digitally evaluates this output signal.

4. An evaluation circuit as claimed in claim 1, characterized in that a diode circuit is provided for generating the temperature-dependent reference voltage.

5. An evaluation circuit as claimed in claim 1, characterized in that the magnetoresistive sensor (1) is provided as a rotational speed sensor for an anti-blocking system of a vehicle.

* * * * *